(12) United States Patent
Seningen et al.

(10) Patent No.: US 6,202,194 B1
(45) Date of Patent: Mar. 13, 2001

(54) METHOD AND APPARATUS FOR ROUTING 1 OF N SIGNALS

(75) Inventors: Michael R. Seningen; James S. Blomgren; Terence M. Potter, all of Austin, TX (US)

(73) Assignee: Intrinsity, Inc., Austin, TX (US)

( * ) Notice: Subject to any disclaimer, the term of this patent is extended or adjusted under 35 U.S.C. 154(b) by 0 days.

(21) Appl. No.: 09/073,478

(22) Filed: May 6, 1998

Related U.S. Application Data

(60) Provisional application No. 60/069,250, filed on Dec. 11, 1997.

(51) Int. Cl.[7] .............................. G06F 17/50; G06F 7/38; H03K 19/173
(52) U.S. Cl. ..................................... 716/10; 716/2; 716/6; 716/8; 716/9; 716/11; 326/38
(58) Field of Search ........................ 395/500, 500.07, 395/500.17, 500.12; 364/491, 489; 174/88, 113 R; 324/539; 716/2, 10; 326/38; 257/206

(56) References Cited

U.S. PATENT DOCUMENTS

| | | | |
|---|---|---|---|
| 2,958,724 | * | 11/1960 | Milloit ................................. 174/88 |
| 4,845,633 | * | 7/1989 | Furtek .................................. 326/38 |
| 5,050,091 | * | 9/1991 | Rubin ................................... 716/10 |
| 5,517,041 | * | 5/1996 | Torii et al. ........................... 257/206 |
| 5,557,779 | * | 9/1996 | Minami ................................... 716/6 |
| 5,677,633 | * | 10/1997 | Moser et al. ......................... 324/539 |
| 5,764,528 | * | 6/1998 | Nakamura ............................... 716/6 |
| 5,801,960 | * | 9/1998 | Takano et al. ........................ 716/10 |
| 5,834,699 | * | 11/1998 | Buck et al. ....................... 174/113 R |
| 5,838,581 | * | 11/1998 | Kuroda .................................. 716/8 |
| 5,838,583 | * | 11/1998 | Varadarajan et al. .................. 716/9 |
| 6,014,506 | * | 1/2000 | Hossain et al. ...................... 716/11 |
| 6,018,622 | * | 1/2000 | Lin et al. .............................. 716/2 |
| 6,018,623 | * | 1/2000 | Chang et al. ........................... 716/6 |
| 6,026,227 | * | 2/2000 | Furtek et al. ........................ 716/16 |

* cited by examiner

*Primary Examiner*—Matthew Smith
*Assistant Examiner*—Jibreel Speight
(74) *Attorney, Agent, or Firm*—Booth & Wright, LLP; Matthew J. Booth (57) ABSTRACT

The present invention is a method and apparatus of routing a 1 of N signal to reduce the effective signal coupling between the signal wires. The present invention is a wire pack with a plurality of wires for routing a 1 of N signal in a semiconductor device. While routing the wires of the wire pack, the present invention rotates the route of each individual wire to reduce the signal coupling between the wires. Additionally, an isolation barrier borders the outside of the wire pack to further reduce the signal coupling. The rotation of the wires allow each individual wire be adjacent to each other wire for part of the wire's route. Other embodiments of the present invention include routing 1 of 3 signals and 1 of 4 signals.

25 Claims, 6 Drawing Sheets

METHOD AND APPARATUS FOR ROUTING 1 OF N SIGNALS

This application claims the benefits of the earlier filed U.S. Provisional Application Ser. No. 60/069,250, filed Dec. 11, 1997 (11.12.1997), which is incorporated by reference for all purposes into this application. Additionally, the application is related to U.S. patent application Ser. No. 09/019,355, filed Feb. 5, 1998 (05.02.1998), now U.S. Pat. No. 6,066,965, which is incorporated by reference for all purposes into this application.

BACKGROUND OF THE INVENTION

1. Field of the Invention

The present invention relates to semiconductor devices. More specifically, the present invention relates to routing signals within a semiconductor device.

2. Description of the Related Art

The current design of integrated circuits (IC) on semiconductor devices typically includes a multiple number of aluminum, aluminum alloy, copper, copper alloy, or tungsten layers separated by silicon dioxide insulators. Each layer comprises a complex pattern of metal wires across the surface of the layer. Connecting the layers together are metal wires or vias. The distance between the wires on a single layer of the IC and the distance between the layers determines the capacitance of each wire. Additionally, the width and height of each wire determines its conductivity (or inversely its resistance). The resistance times capacitance (RC) of a wire is a time constant that directly determines the time it takes to charge or discharge the capacitance of the wire.

An IC or logic circuit consumes power when conducting current through the wires either directly from the power pins to the ground pins or when charging or discharging a capacitor (within the circuit). Most power consumed within a CMOS circuit, however, comes from the charging/discharging of the capacitors. A capacitor in a logic circuit occurs due to the inherent capacitance of the metal wires that are within the circuit itself (i.e., inside the transistors and the wires in-between the transistors). Metal wires have capacitance that is a function of their surface area and their proximity to neighboring wires, while the capacitance of transistors is a function of their size. In other words, a logic circuit will consume more power if the circuit contains bigger transistors and or contains more wires or greater lengths of wire.

Figure 1:
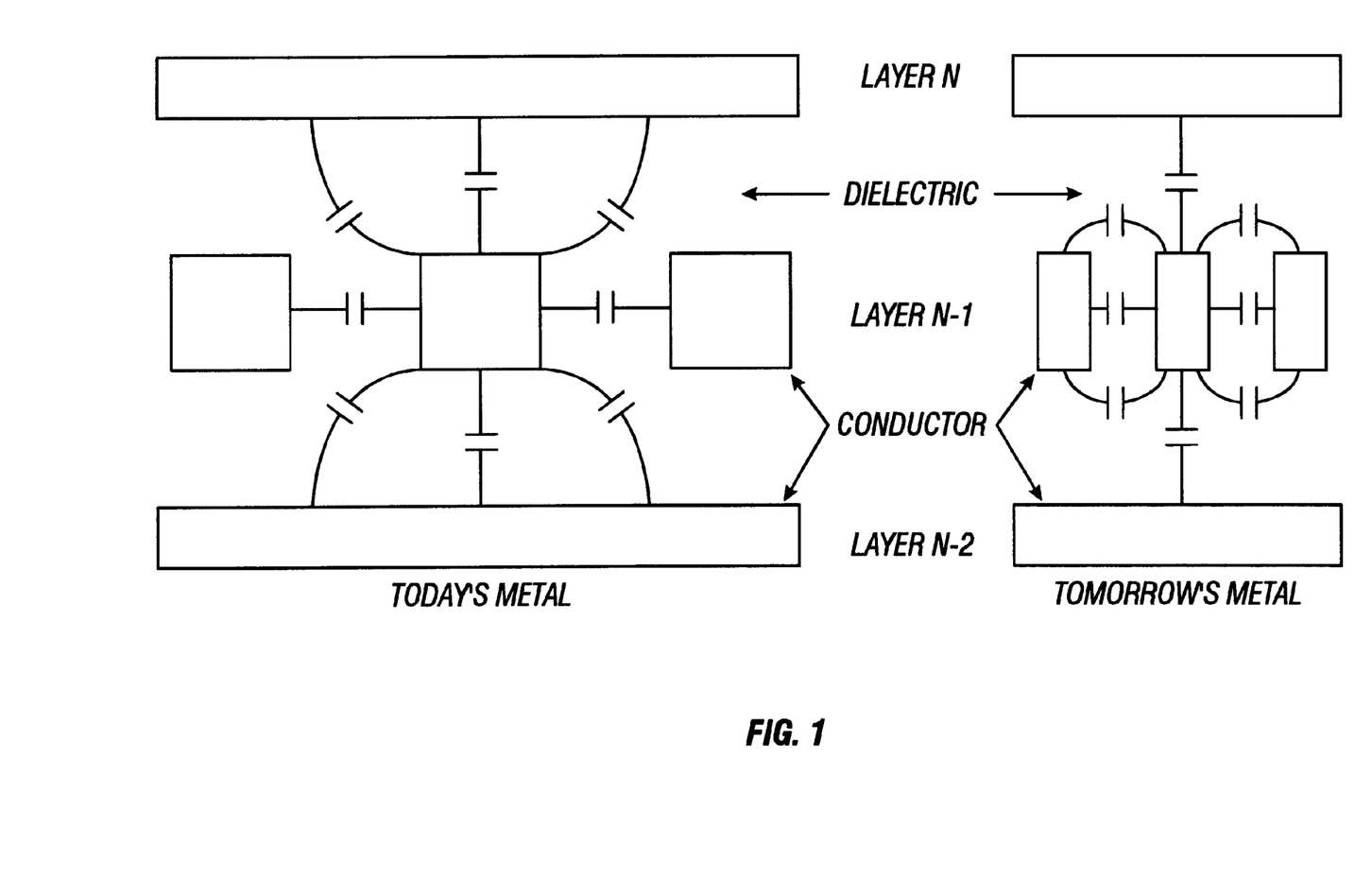
FIG. 1 is a cross section of an IC device that illustrates the capacitive coupling of the signal wires in the device.

As the lithography improves and the spacing of wires gets closer together, their aspect ratio will change as shown in FIG. 1, which illustrates the capacitive coupling between neighboring signal wires in a semiconductor device and the capacitive coupling between adjacent layers by showing a cross-section of three metal layers. FIG. 1 additionally illustrates the current physical layout of an IC compared to a future IC layout. The height or the distance between layers will most likely remain unchanged as the width of the wires and spacing between the wires decreases. The wire height will most likely not decrease because a 50% reduction in both height and width would result in a wire with only 25% the conductivity, which is an unacceptable result for both signal and power routing. The spacing between layers can expect at best to be kept about the same. The relative distances between the conductors in the same layer will change, and this has an important impact on the signal carrying capabilities of the wires. As wires grow closer to their neighbors and relatively more distant from the conductors on adjacent layers, the ratio of capacitance between adjacent layers and neighbors will shift such that most of a wire's capacitive coupling will be to adjacent or neighboring wires.

If there was only a single wire on an IC, a designer would not care about a wire's capacitive coupling. Unfortunately, any given wire on an IC has neighboring wires and or adjacent wires that also carry signals. Since these other wires must carry signals, they are not held at static voltage levels. When a wire changes voltage, its charge capacitively couples to other wires in its vicinity and vice versa. A rising voltage on a wire will induce a rising voltage on a neighboring wire. If we were examining a wire and its neighboring wire transitions to a differing potential (i.e., the voltages are changing in opposite directions), we would see that the wire of interest would develop an induced charge that makes the wire's capacitance appear to increase. FIG. 1 illustrates the capacitive coupling of a wire with its neighboring wires and adjacent layer wires.

The degree of capacitive coupling between the two wires is the result of the amount of wire surface area each wire has in close proximity with the other wire. This amount of close wire surface area between wires is why there is a difference between neighbor capacitance and adjacent layer capacitance. Wires in adjacent layers run perpendicularly, which limits the common area between interlayer wires to a very small space, and directly limits any coupling effect, but wires in the same layer run next to each other for, potentially, their entire length, and can experience a dramatic coupling effect. As a result, except for uncommon cases, it is reasonable to assume there is no significant coupling between layers (interlayer coupling), while there is significant coupling within each layer (intralayer coupling).

Signal coupling is a problem for all integrated circuits because it degrades signal quality, alters signal propagation, and can cause logic failures. A design that tolerates signal coupling will require increased margins between wires, which directly reduces overall performance. The unfortunate fact is that technology is evolving to increase the amount of wire capacitance subject to coupling at the same time it is moving delay from the transistors into the wires. What used to be a minor annoyance for circuit designs has now become a major issue with interconnect. Improvements in dielectrics and conductors will help alleviate the problem, but it will continue to worsen as IC geometries shrink. Today's technology, when using the most aggressive metal spacing, has about two thirds of the total wire capacitance between neighbors, and within a few years this figure will be closer to three fourths.

With the prior art's problem with signal coupling, there exists a need to send information a given distance in an IC device with as low an effective capacitance as possible. Since signal coupling increases the effective capacitance of a datapath and or a logic device, reducing the signal coupling will improve the transmission of the information through the IC device. The present invention overcomes the signal coupling problem with a novel method and apparatus of routing a 1 of 4 signal to reduce the effective signal coupling between neighboring or adjacent layer signal wires. While routing the wires of a wire pack, the present invention rotates the route of each individual wire to reduce the signal coupling between the wires. The present invention also reduces the signal coupling when routing 1 of 3 signals and 1 of N signals.

SUMMARY OF THE INVENTION

The present invention comprises a method and apparatus of routing a 1 of 4 signal in an IC semiconductor device to reduce the effective signal coupling between the signal wires. The present invention comprises a wire pack with a first, second, third, and fourth wire for routing a 1 of 4 signal in a semiconductor device. While routing the wires of the wire pack, the present invention rotates the route of each individual wire to reduce the signal coupling between the wires. The rotation of the wires allow each individual wire to be adjacent to each other wire for ½ of the wire's route. Additionally, an isolation barrier may border the outside of the 1 of 4 signal wire pack to further reduce the signal coupling where the isolation barrier may comprise an unoccupied via channel or a fixed potential wire.

The present invention additionally comprises a method and apparatus of routing a 1 of N signal to reduce the effective signal coupling between the signal wires. The present invention comprises a wire pack with a plurality of wires for routing a 1 of N signal in a semiconductor device. Other embodiments of the present invention include routing 1 of 3 signals and 1 of 4 signals. While routing the wires of the wire pack, the present invention rotates the route of each individual wire to reduce the signal coupling between the wires. The rotation of the wires allow each individual wire to be adjacent to each other wire for part of the wire's route. Additionally, an isolation barrier may border the outside of the 1 of 4 signal wire pack to further reduce the signal coupling where the isolation barrier may comprise an unoccupied via channel or a fixed potential wire.

DESCRIPTION OF THE DRAWINGS

To further aid in understanding the invention, the attached drawings help illustrate specific features of the invention and the following is a brief description of the attached drawings.

DETAILED DESCRIPTION OF THE INVENTION

The present invention comprises a method and apparatus of routing a 1 of 4 signal to reduce the signal coupling between the signal wires. Other embodiments of the present invention include routing 1 of 3 signals, 1 of 8 signals, and 1 of N signals. This disclosure describes numerous specific details that include specific encodings, structures, circuits, and logic functions in order to provide a thorough understanding of the present invention. One skilled in the art will appreciate that one may practice the present invention without these specific details. Additionally, this disclosure does not describe some well known structures such as transistors and FETs in detail in order not to obscure the present invention.

The present invention describes the fundamental components of a new logic family, the "N-NARY" logic family.

The N-NARY design style introduces numerous new concepts, one of which includes the abandonment of strictly binary circuits. While binary signals still exist in this design style, they are uncommon. Instead, trinary and greater signals dominate adders, shifters, boolean units, and even entire datapaths. In fact, the most common signal type of the present invention is quaternary, or four valued, for which we introduce the word "dit" to indicate the two bits (or dual bits) worth of information represented by the quaternary signal. Since the logic family supports many different signal types other than quaternary, we call the design style "N-NARY".

The N-NARY logic family supports a variety of signal encodings that are of the 1 of N form where N is any integer greater than one. The preferred embodiment of the present invention uses a 1 of 4 signal with a 1 of 4 encoding that uses a wire pack comprising four wires to indicate one of four possible values. Other embodiments of the present invention use 1 of 3 signals, 1 of 8 signals, and 1 of N signals. In the N-NARY design style, a 1 of 4 (or a 1 of N) signal is a bundle of wires (a wire pack) kept together throughout the inter-cell route, which requires the assertion of no more than one wire either while precharging or evaluating. A traditional design in comparison would use only two wires to indicate four values by asserting neither, one, or both wires together. The number of additional wires represents one difference of the N-NARY logic style, and on the surface makes it appear unacceptable for use in microprocessor designs. One of N signals are less information efficient than traditional signals because they require at least twice the number of wires, but N-NARY signals have the advantage of including signal validation information, which is not possible with traditional signals. It is this additional information (the fact that when zero wires are asserted the result is not yet known) that indirectly allows us to eliminate P-channel logic and all of the series synchronization elements required in traditional designs.

One of the disadvantages of prior art dynamic logic circuits is their power consumption. As previously noted, power consumption occurs during the switching of the FETs within a circuit when conductive pathways are open between the power pins and the ground pins or when charging/discharging the capacitors of the circuit.

Power is proportional to the amount of charge moved and the potential it is moved across. When a capacitor discharges, the amount of charge is given by:

$$Q=CV \quad (1)$$

Where
  Q is the quantity of charge,
  C is the capacitance, and
  V is the voltage.
Thus, the energy involved with charging or discharging a capacitor is given by:

$$E=CV^2 \quad (2)$$

If we have a circuit within a processor, the power that circuit consumes is given by the energy involved with charging or discharging its capacitance per second:

$$P=fsCV^2 \quad (3)$$

Where
  f is the frequency of the part, and
  s is the switch factor for the circuit.
The switch factor for a signal is an indication of how often the signal switches per cycle, and is a simple ratio. Typical static CMOS signals may have an average switch factor of approximately 0.20. A dual rail dynamic signal has two wires, one of which is guaranteed to evaluate and precharge. This means that in each cycle, one of the two wires switches twice, for a switch factor of 1.0. In contrast, an N-NARY logic function with a 1 of 4 signal contains four wires, exactly one of which evaluates and then precharges, for a switch factor of 0.50. If the frequency, capacitance, and voltage are held constant for these three logic families, then N-NARY 1 of 4 logic will use half the power that dual rail dynamic logic uses. Therefore, we can modify Equation 3 to give us the power consumption for 1 of 4 signals:

$$P=0.5 \cdot fCV^2 \qquad (4)$$

Any increase in capacitance will increase the power consumption of a dynamic logic device when it evaluates. One example of an increase in capacitance within a circuit occurs from the wire to wire capacitance from adjoining wires when the adjoining logic paths' or wires are concurrently conducting signals. (see e.g., the adjoining conductors in FIG. 1).

The present invention overcomes the above signal coupling problems by a novel method and apparatus of routing a 1 of 4 signal. The present invention is suitable for use with the N-NARY logic family, which uses a 1 of N encoding to reduce the number of conducting (or active) wires or logic paths (carrying signals) that a logic tree will evaluate in a given evaluation cycle. There are a variety of techniques to encode information that includes for example binary encoding where a N-bit binary number can represent $2^N$ possible values. However, one of our requirements is that there is a value or number representation that indicates when the signal or group of signals is NOT valid (in other words, we expect each signal to indicate its validity). We also want to avoid having adjacent wires having concurrent high signals that leads us to further define that one and only one logic path in the 1 of N encoding has an active high signal (or an active high logic state) on it during a single evaluation cycle when the data signal is available. All of these additional conditions prompts us to modify the form of encoding since the convenient arrangement of $2^N$ values for N bits is no longer possible. As a result, we end up with at least two wires (in most cases) for each single bit of binary information, where each signal indicates when it is valid on the logic path by transitioning to a high state, and where one signal indicates a logical zero when it is high, and another signal indicates a logical one when it is high, which results in the following definition table:

TABLE 1

| A | AN | Meaning |
|---|----|---------|
| 0 | 0  | Value not yet available |
| 0 | 1  | Value available, zero |
| 1 | 0  | Value available, one |
| 1 | 1  | Unused encoding (cannot happen) |

We call the encoding in the above table a 1 of 2 encoding where the encoding efficiency is N possible values per N wires. In N-NARY logic, the definition of the state where the true of the signal (A) and the false or complement of the signal (AN) are (0,0) means that the N-NARY device is in precharge or that the data signal has not arrived. With the timing of the data signal embedded into the signal itself, the transition of either A or AN to high indicates both the arrival of the signal and the value of the signal, i.e., whether it's true (on A) or false (on AN).

We can extend the above encoding rules to additional or multiple bits. For example, with 2 bits (which can use 4 wires as a 1 of 4 encoding), we can have four possible combinations for what values the two binary bits can have: 0, 1, 2 and 3. For 3 bits (which can use 8 wires as 1 of 8 encoding), we have eight combinations: 0, 1, 2, 3, 4, 5, 6 and 7. The following table illustrates some of the encodings possible with 1 of N encoding:

TABLE 2

| 1 of 3 | 1 of 4 | 1 of 8 | 1 of 16 | Meaning |
|--------|--------|--------|---------|---------|
| 000 | 0000 | 00000000 | 0000000000000000 | Value not yet available |
| 001 | 0001 | 00000001 | 0000000000000001 | Value available, 0 |
| 010 | 0010 | 00000010 | 0000000000000010 | Value available, 1 |
| 100 | 0100 | 00000100 | 0000000000000100 | Value available, 2 |
|     | 1000 | 00001000 | 0000000000001000 | Value available, 3 |
|     |      | 00010000 | 0000000000010000 | Value available, 4 |
|     |      | 00100000 | 0000000000100000 | Value available, 5 |
|     |      | 01000000 | 0000000001000000 | Value available, 6 |
|     |      | 10000000 | 0000000010000000 | Value available, 7 |
|     |      |          | 0000000100000000 | Value available, 8 |
|     |      |          | 0000001000000000 | Value available, 9 |
|     |      |          | 0000010000000000 | Value available, 10 |
|     |      |          | 0000100000000000 | Value available, 11 |
|     |      |          | 0001000000000000 | Value available, 12 |
|     |      |          | 0010000000000000 | Value available, 13 |
|     |      |          | 0100000000000000 | Value available, 14 |
|     |      |          | 1000000000000000 | Value available, 15 |

Note that 1 of 4 encoding provides 4 possible values or two binary bits worth of information. A 1 of 8 encoding provides 8 possible values or three binary bits worth of information. And, a 1 of 16 encoding provides 16 possible values or four binary bits worth of information.

Since the encoding efficiency is N possible values of information per N wires, the encoding efficiency per wire decreases with the higher one of N encodings ( as N increases). An increasing number of wires produces a wire disadvantage for higher one of N encodings:

TABLE 3

| encoding | wires | binary bits | wires per bit |
|----------|-------|-------------|---------------|
| 1 of 2 | 2 | 1 | 2.0 |
| 1 of 3 | 3 | 2.0 | About 1.5 |
| 1 of 4 | 4 | 2 | 2.0 |
| 1 of 8 | 8 | 3 | 2.7 |
| 1 of 16 | 16 | 4 | 4.0 |
| 1 of 32 | 32 | 5 | 6.4 |
| 1 of 64 | 64 | 6 | 10.3 |
| 1 of 128 | 128 | 7 | 18.3 |
| 1 of 256 | 256 | 8 | 32.0 |

Figure 2:
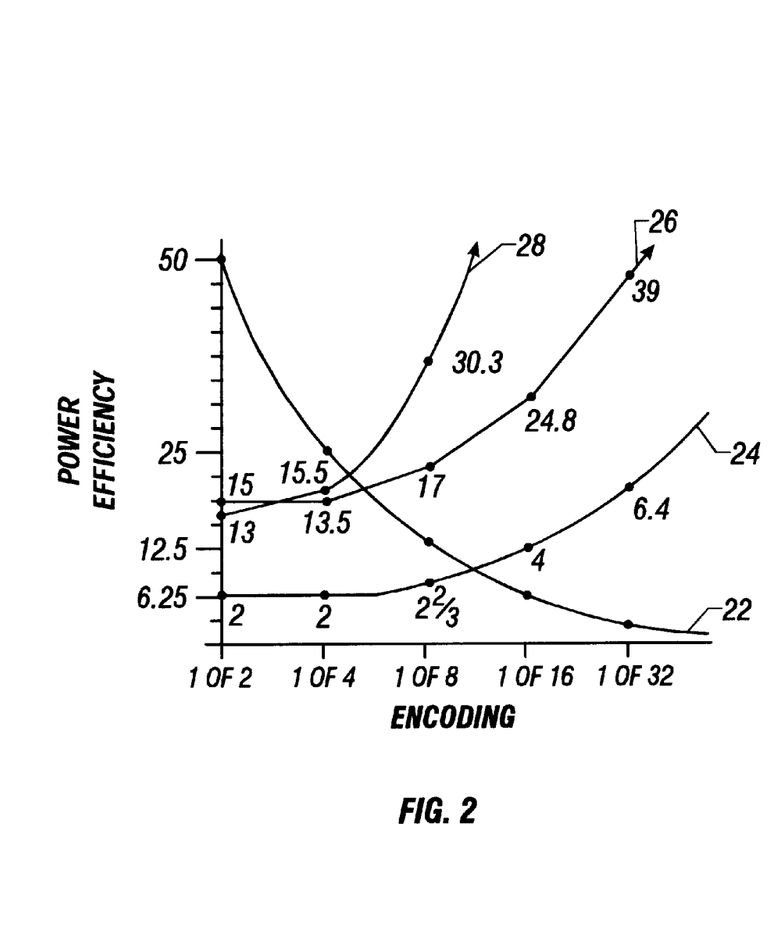
FIG. 2 illustrates the wire efficiency of 1 of N signals.

The degree of encoding determines the encodings' wire efficiency. For example, a 1 of 2 signal requires two wires to encode one bit of information. A 1 of 3 signal requires 3 wires to encode less than 2 bits of information, which is about 1.5 wires per bit of information and is more efficient. A 1 of 4 signal requires four wires to encode four values, or the equivalent of two bits of information. In the 1 of 2 encoding and 1 of 4 encoding cases, the wire efficiency is two wires per bit of information. A 1 of 8 signal requires eight wires to encode three bits of information, which is 2.7 wires per bit of information, less efficient than the prior encodings. Similarly, 1 of 16, 1 of 32 and 1 of 64 have wire efficiencies of 4, 6.4 and 10.7 respectively. As Table 3 illustrates, 1 of 2 and 1 of 4 encodings are equally efficient, and a 1 of 3 encoding is even more efficient. (1 of e is the most efficient, but is not achievable using on/off signals). For example, six wires can encode three 1 of 2 signals or two 1 of 3 signals. Three 1 of 2 signals provide eight possible values, while two 1 of 3 signals provide nine, or one more value than the three 1 of 2 signals. Line 24 of FIG. 2 illustrates the wire cost per bit information for the 1 of N encodings. Higher degrees of 1 of N encoding quickly become expensive in terms of wire efficiencies. Unless there is an important functional, topological, or power requirement, it is usually not advantageous to use encodings beyond 1 of 8. Within RAMs, however, the word lines are one example where, due to topology, a 1 of 128 encoding can make perfect sense.

The switch factor of a circuit is important because it directly determines power consumption and indirectly determines circuit speed. The power consumption in a logic circuit varies according to how many wires evaluate per bit of encoded information. If the circuit has a high power consumption, we must provide more route resources to connect gates to power and ground and also require that some devices be larger, (especially the evaluate devices in N-NARY cells). Using a 1 of N encoding reduces the power consumption for a given logic circuit. In a given cycle, one data signal in any of the above 1 of N encodings will evaluate, such that a 1 of 2 encoding has 50% of its wires evaluate, a 1 of 3 encoding has 33% of its wires evaluate, a 1 of 4 encoding has 25% of its wires evaluate, a 1 of 8 encoding has 12.5% of its wires evaluate, etc. Therefore, more wires provide a power consumption advantage for higher 1 of N encodings:

TABLE 4

| encoding | wires | binary bits | per bit | switch factor |
|---|---|---|---|---|
| 1 of 2 | 2 | 1 | 2.0 | 50.0% |
| 1 of 3 | 3 | 2 | 1.5 | 33.3% |
| 1 of 4 | 4 | 2 | 2.0 | 25.0% |
| 1 of 8 | 8 | 3 | 2.7 | 12.5% |
| 1 of 16 | 16 | 4 | 4.0 | 6.3% |
| 1 of 32 | 32 | 5 | 6.4 | 3.1% |
| 1 of 64 | 64 | 6 | 10.3 | 1.6% |
| 1 of 128 | 128 | 7 | 18.3 | 0.8% |
| 1 of 256 | 256 | 8 | 32.0 | 0.4% |

Implementing devices in 1 of N encodings can either be advantageous or disadvantageous from a power efficiency perspective and depends on the function of the device (e.g., ADD, Boolean AND, OR, etc.). Functions that desire adjacent bit information to be pre-encoded, such as adders, experience a reduced power consumption (power efficiency) advantage for using higher one of N encodings. Functions that do not want adjacent bit information encoded such as OR gates experience a reduced power consumption (power efficiency) disadvantage for higher one of N encodings. Functions that do not alter the values, such as multiplexers and storage elements experience neither a reduced power consumption advantage nor a disadvantage for higher 1 of N encodings. An additional consideration to the reduced power consumption (power efficiency) advantage or disadvantage is the cost of the additional wires per bit, which is an important consideration in constructing transistor gates.

Table 5 illustrates the reduced power consumption for 1 of N encodings for different functions. The OR gate example shows that there is a power efficiency disadvantage to the higher 1 of N encodings when we do not want adjacent information encoded into each bit position. The multiplexer example shows that there actually is an advantage to a 1 of 4 encoding because the multiplexer treats data without regard to its encoding (included within this advantage is that there is a sharing of portions of the evaluate tree and the evaluate device). Note that most structures in a microprocessor are multiplexers.

TABLE 5

| Encoding | wires | binary bits | wires per bit | switch factor (power) | OR transistors per bit | MUX transistors per bit |
|---|---|---|---|---|---|---|
| 1 of 2 | 2 | 1 | 2.0 | 50.0% | 13.0 | 15.0 |
| 1 of 4 | 4 | 2 | 2.0 | 25.0% | 15.5 | 13.5 |
| 1 of 8 | 8 | 3 | 2.7 | 12.5% | 30.3 | 17.0 |
| 1 of 16 | 16 | 4 | 4.0 | 6.3% | 76.8 | 24.8 |
| 1 of 32 | 32 | 5 | 6.4 | 3.1% | 224.6 | 39.0 |

FIG. 2 is an illustration of Table 5 that shows the power efficiency per wire of the present invention as N increases for 1 of N encodings. Line 22 illustrates the reduction in power consumption for higher 1 of N encodings. Line 24 illustrates the wires per bit for the 1 of N encodings. Line 26 illustrates transistors per bit for the multiplexer example and line 28 illustrates the transistors per bit for an OR example.

The above discussion of the 1 of N encoding for N-NARY logic allows us to define a 1 of N signal as a wire pack that comprises a plurality of wires (the physical metal trace), one and only one wire that can evaluate true, which indicates the signal's value (or predefined logic state). For example, a 1 of 4 signal is a signal composed of a wire pack of 4 wires, and can communicate four different values using 1 of 4 encoding, or two bits of information. Another example is a 1 of 2 signal that is a signal composed of a wire pack of 2 wires, and can communicate two values using 1 of 2 encoding, or one bit of information. And, another example is a 1 of 8 signal that is a signal composed of a wire pack of 3 wires, and can communicate 8 values using 1 of 8 encoding, or three bits of information.

Figure 3:
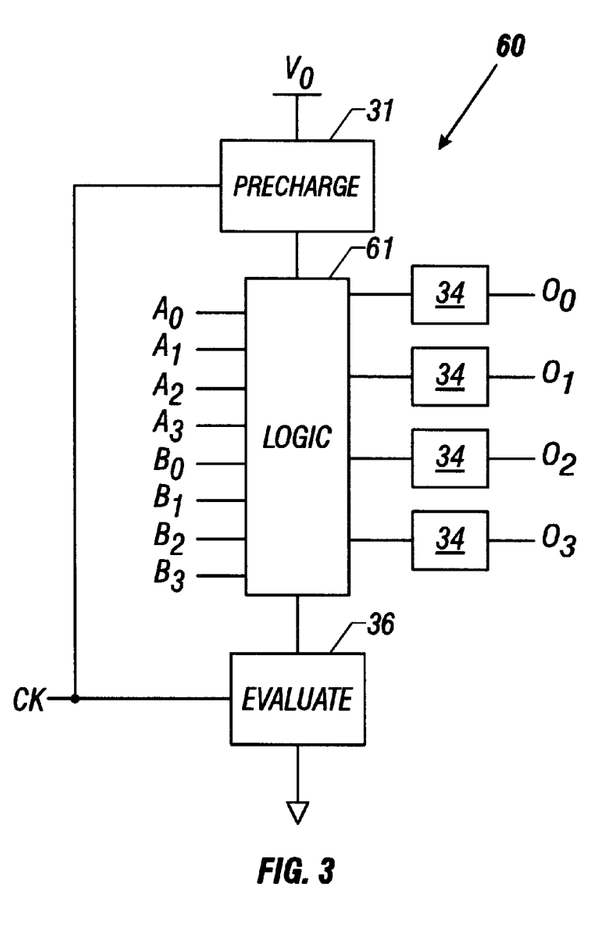
FIG. 3 is a block diagram of an N-NARY logic device that uses 1 of 4 signals.
Figure 4:
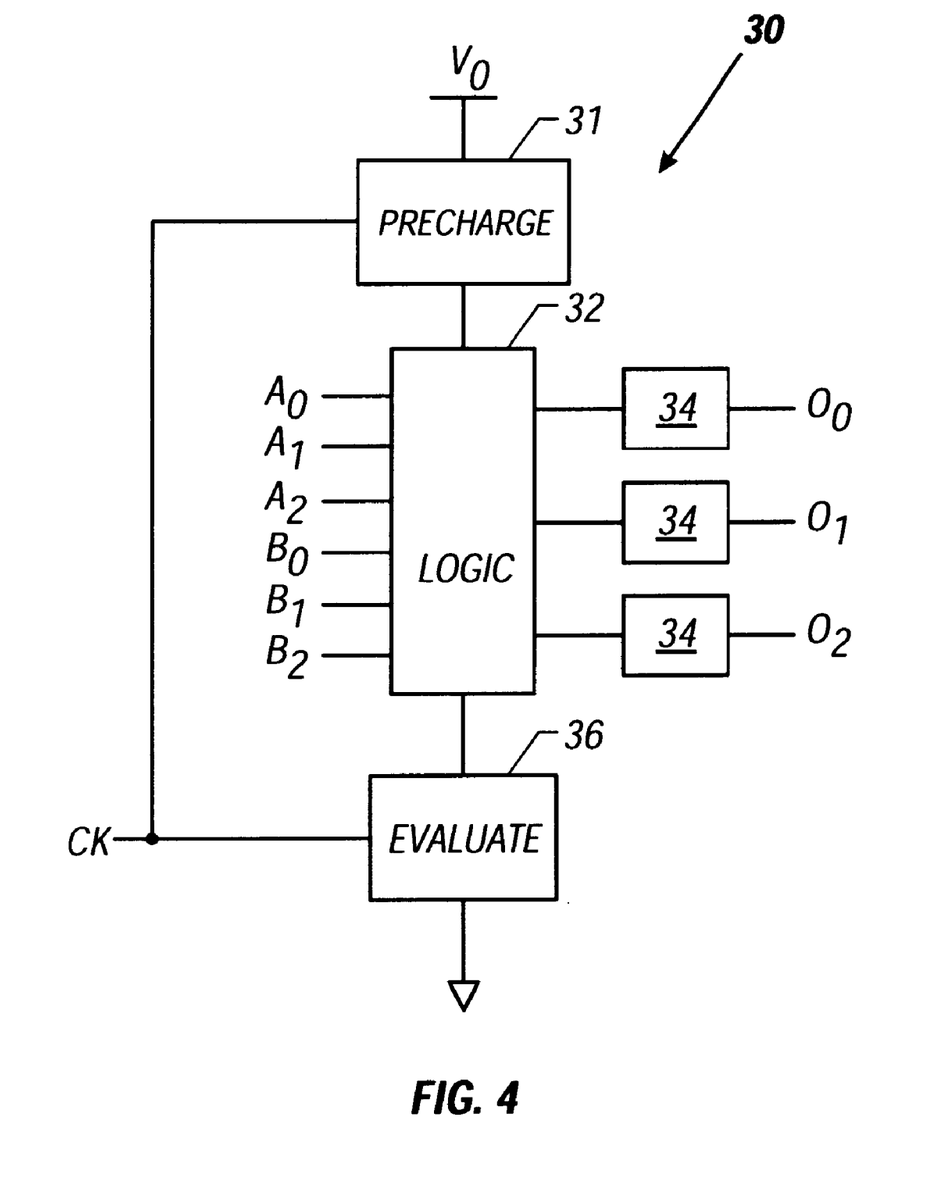
FIG. 4 is a block diagram of an N-NARY logic device that uses 1 of 3 signals.
Figure 5:
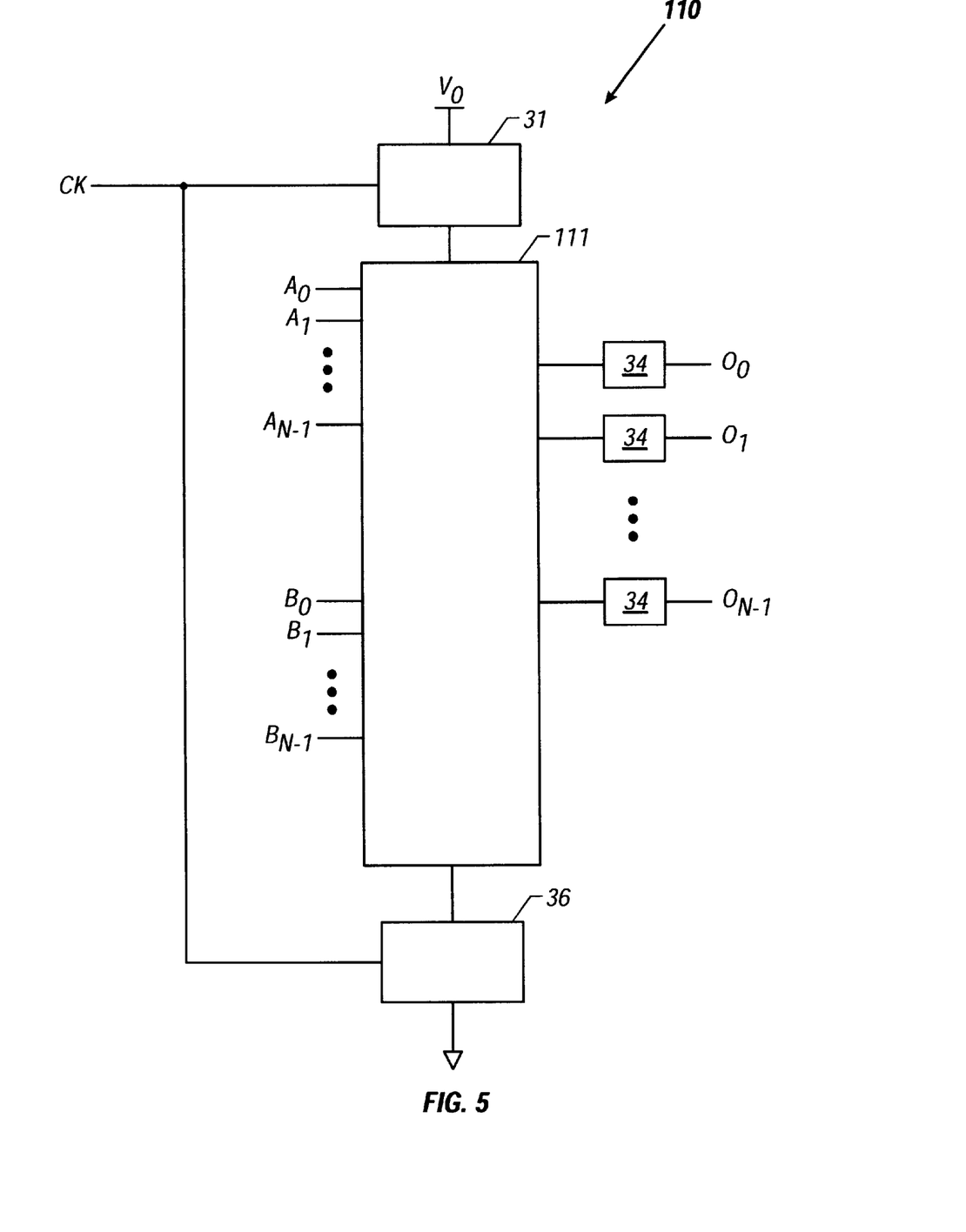
FIG. 5 is a block diagram of an N-NARY logic device that uses 1 of N signals.

FIGS. 3, 4, and 5 illustrate different logic gates constructed using different types of 1 of N signals. FIG. 3 illustrates a logic device that uses two 1 of 4 signals for the input signals and a 1 of 4 signal for the output signal. A device 60 comprises a logic tree circuit 61, a precharge circuit 31, and an evaluate circuit 36. Coupled to the logic tree circuit is the 2 bit input a that is a 1 of 4 signal that comprises a plurality of input values $A_0, A_1, A_2,$ and $A_3$ and their associated wire pack using a 1 of 4 encoding. Additionally coupled to the logic tree circuit is the 2 bit input b that is a 1 of 4 signal that comprises a plurality of input values $B_0, B_1, B_2,$ and $B_3$ and their associated wire pack using a 1 of 4 encoding. And, coupled to the logic tree circuit is the 2 bit output o that is 1 of 4 signal that comprises a plurality of output values $O_0, O_1, O_2,$ and $O_3$ and their associated wire pack using a 1 of 4 encoding. The logic tree circuit 61 performs a logic function on a plurality of input signals that could comprise a variety of functions, for example, the Boolean logic functions AND/NAND, OR/NOR, or XOR/Equivalence. The logic tree circuit 61 comprises one or more FETs with the preferred embodiment of the logic tree circuit comprising N-channel FETs. Coupled to the individual wires of the output signal are the output buffers 34 that aid in driving additional circuits that couple to the output signals.

A precharge circuit 31 couples to the logic tree circuit 61 and precharges the dynamic logic of the logic tree circuit. Coupled to the precharge circuit 31 is the clock signal CK. Additionally, an evaluate circuit 36 couples to the logic tree circuit and controls the evaluation of the logic tree circuit. Coupled to the evaluate circuit 36 is the clock signal CK.

If the logic function of logic tree circuit 61 performed an OR/NOR function, then the resulting truth table would be Table 6. The mapping of the 1 of 4 encoding for the output comprises a variety of truth tables other than the example above and is dependent on the circuit design. However, Table 6 illustrates that one and only one logic path of the 1 of N encoding has an active high signal (or an active logic state) on it during a single evaluation cycle when the data signals are available. In FIG. 3, there are two 1 of 4 signals for the input signals and a 1 of 4 signal for the output signal. The N-NARY logic family provides that the input or output signals may have multiple sets of signals (and logic paths) of 1 of N signals. For example, in each state in Table 6 for the input values $A_0$ through $A_3$, there is one and only one input logic path or wire that has an active high signal on it. In each state in Table 6 for the input values $B_0$ through $B_3$, there is one and only one input logic path or wire that has an active high signal on it. And, in each state in Table 6 for the output values $O_0$ through $O_3$, there is one and only one output logic path that has an active high signal on it.

TABLE 6

| $A_3$ | $A_2$ | $A_1$ | $A_0$ | $B_3$ | $B_2$ | $B_1$ | $B_0$ | $O_3$ | $O_2$ | $O_1$ | $O_0$ |
|---|---|---|---|---|---|---|---|---|---|---|---|
| 0 | 0 | 0 | 0 | 0 | 0 | 0 | 0 | 0 | 0 | 0 | 0 |
| 0 | 0 | 0 | 1 | 0 | 0 | 0 | 1 | 0 | 0 | 0 | 1 |
| 0 | 0 | 0 | 1 | 0 | 0 | 1 | 0 | 0 | 0 | 1 | 0 |
| 0 | 0 | 0 | 1 | 0 | 1 | 0 | 0 | 0 | 1 | 0 | 0 |
| 0 | 0 | 0 | 1 | 1 | 0 | 0 | 0 | 1 | 0 | 0 | 0 |
| 0 | 0 | 1 | 0 | 0 | 0 | 0 | 1 | 0 | 0 | 1 | 0 |
| 0 | 0 | 1 | 0 | 0 | 0 | 1 | 0 | 0 | 0 | 1 | 0 |
| 0 | 0 | 1 | 0 | 0 | 1 | 0 | 0 | 1 | 0 | 0 | 0 |
| 0 | 0 | 1 | 0 | 1 | 0 | 0 | 0 | 0 | 1 | 0 | 0 |
| 0 | 1 | 0 | 0 | 0 | 0 | 0 | 1 | 0 | 1 | 0 | 0 |
| 0 | 1 | 0 | 0 | 0 | 0 | 1 | 0 | 0 | 1 | 0 | 0 |
| 0 | 1 | 0 | 0 | 0 | 1 | 0 | 0 | 0 | 0 | 1 | 0 |
| 0 | 1 | 0 | 0 | 1 | 0 | 0 | 0 | 0 | 1 | 0 | 0 |
| 1 | 0 | 0 | 0 | 0 | 0 | 0 | 1 | 1 | 0 | 0 | 0 |
| 1 | 0 | 0 | 0 | 0 | 0 | 1 | 0 | 0 | 1 | 0 | 0 |
| 1 | 0 | 0 | 0 | 0 | 1 | 0 | 0 | 0 | 1 | 0 | 0 |
| 1 | 0 | 0 | 0 | 1 | 0 | 0 | 0 | 1 | 0 | 0 | 0 |

FIG. 4 illustrates a logic device that uses two 1 of 3 signals for the input signals and a 1 of 3 signal for the output signal. This logic device operates in a manner similar to the device of FIG. 3, and comprises a device 30 that further comprises a logic tree circuit 32, a precharge circuit 31, and an circuit device 36. Coupled to the logic tree circuit is the 2 bit input a that is a 1 of 3 signal that comprises a plurality of input values $A_0$, $A_1$, and $A_2$ and their associated wires using a 1 of 3 encoding. Additionally coupled to the logic tree circuit is the 2 bit input b that is a 1 of 3 signal that comprises a plurality of input values $B_0$, $B_1$, and $B_2$ and their associated wires using a 1 of 3 encoding. And, coupled to the logic tree circuit is the 2 bit output o that a 1 of 3 signal that comprises a plurality of output values $O_0$, $O_1$, and $O_2$ using a 1 of 3 encoding. The logic tree circuit 32 performs a logic function on the input signals that could comprise a variety of functions, for example, the Boolean logic functions AND/NAND, OR/NOR, or XOR/Equivalence.

FIG. 5 illustrates an N-NARY logic circuit using 1 of N signals with a 1 of N encoding. An N-NARY logic circuit generally comprises a device 210 that further comprises a logic tree circuit 211, a precharge circuit 31, and an evaluate circuit 36. Coupled to the logic tree circuit is a 1 of N input signal a that comprises a plurality of input values $A_0$ through $A_{N-1}$ and their associated wires using a 1 of N encoding. Additionally coupled to the logic tree circuit is a 1 of N input signal b that comprises a plurality of input values $B_0$ through $B_{N-1}$ and their associated wires using a 1 of N encoding. And, coupled to the logic tree circuit is a 1 of N output signal o that comprises a plurality of output values $O_0$ through $O_{N-1}$ using a 1 of N encoding. Some embodiments of an N-NARY logic circuit provide for all of the signals to be of the same type of 1 of N signal, while other embodiments provide for mixing different types of 1 of N signals. The logic tree circuit 211 performs a logic function on a plurality of input signals that could comprise a variety of functions.

The plurality of wires that comprise a 1 of 4 signal have a predictable behavior. Typically, a single N-NARY gate such as illustrated in FIG. 3 produces a 1 of 4 signal so that the wires of the signal will have the same precharge and evaluate times and signal edges. Since the wires typically go to the same destinations, an IC layout tool can route the wires of the 1 of 4 signal together as a wire pack, which is one tight bundle of four wires. Since one and only one wire of the wire pack (or four wires) is active high during an evaluation cycle, the other 3 neighboring wires are not changing. If the route of the active wire is between its adjacent neighbors (of the 1 of 4 bundle), then this wire will not encounter coupling from the same layer (intralayer). From our previous discussion, we know that we can ignore the coupling from adjacent layers (interlayer). If we route the wires of a 1 of 4 signal directly to the next gate, the inner wires of the 1 of 4 signal will not encounter any intralayer coupling because these wires always have neighboring wires that are not changing. Unfortunately, the outer wires of the 1 of 4 signal are subject to the influence of wires of other 1 of 4 signals routed in adjacent channels. The present invention provides for an improved routing of the 1 of 4 signals by rotating the wires so that the inner and outer wires are not always in the same position in the route plan.

Figure 6:
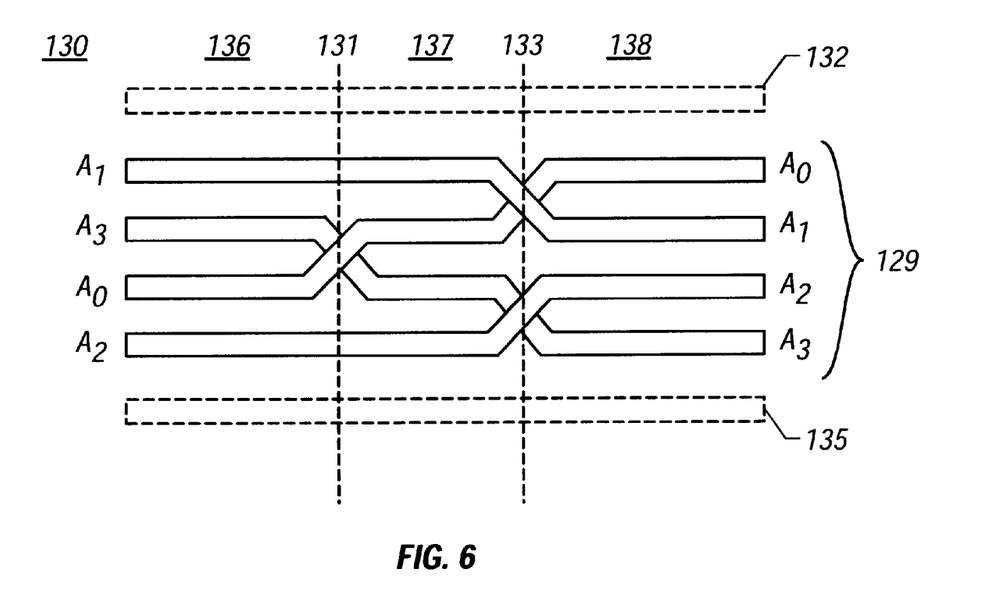
FIG. 6 illustrates an embodiment of the present invention that rotates the route of a 1 of 4 signal.

FIG. 6 illustrates an embodiment of the present invention that includes a route 130 for a 1 of 4 signal that comprises a wire pack 129 that further comprises four wires (or logic paths) that carry or conduct the logic values $A_0$, $A_1$, $A_2$, and $A_3$. Bordering on one or both sides of the wire pack 129 are the isolation barriers 132 and 135. The preferred embodiment of the present invention uses unoccupied channels for the isolation barriers. Other embodiments of the present invention include the use of a fixed potential wire as the isolation barrier where the fixed potential wire comprises a ground wire, a power wire, or a node that has effectively no potential charge at any time of interest. Thus, one skilled in the art will appreciate that 132 and 135 in FIG. 6 can also illustrate the placement of fixed potential wires such as previously described.

The route 130 comprises a pre-rotated section of wires 136, a first rotated section of wires 131, a middle rotated section of wires 137, a second rotated section of wires 133, and a post rotated section of wires 138. The present invention uses one or more rotations of the wire with the preferred embodiment using multiple rotations of the different wires of the wire pack of the 1 of 4 signal. Additionally, other embodiments of the present invention include repeating the series of rotations as described in FIG. 6 one or more times. The rotation of the wires of the present invention has the effect of ensuring that each wire is adjacent to two neighboring wires in the wire pack for part of its total same-metal-layer neighborhood where the preferred embodiment of the invention allows each individual wire to be adjacent to each other wire for ½ of the wire's route. Additionally, the present invention includes a number of other techniques for rotating the wires. If this was not a 1 of 4 signal, and especially if it was simply a group of four static signals with no knowledge of their timing, we would not be able to predict the interaction of the wires. Since this is a 1 of 4 signal, it is well behaved, and the two possible forms of wire coupling (discussed later in the specification), failure and speed, are dramatically reduced.

Figure 7:
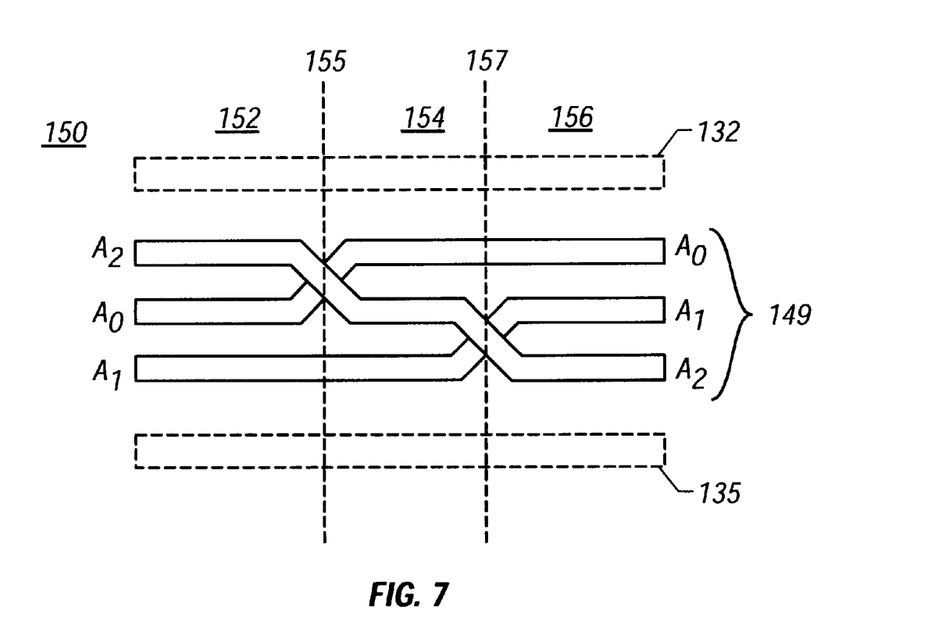
FIG. 7 illustrates an embodiment of the present invention that rotates the route of a 1 of 3 signal.

FIG. 7 illustrates another embodiment of the present invention that operates in a similar manner to the above embodiment for 1 of 4 signals and comprises a metal route 150 for a 1 of 3 signal that comprises a wire pack 149 that further comprises the 3 wires (or logic paths) that carry or conduct the logic values $A_0$, $A_1$, and $A_2$. Bordering on one or both sides of the wire pack 149 are the isolation barriers 132 and 135. The route 150 additionally comprises a pre-rotated section of wires 152, a first rotated section of wires 155, a middle rotated section of wires 154, a second rotated section of wires 157, and a post rotated section of wires 156.

Figure 8:
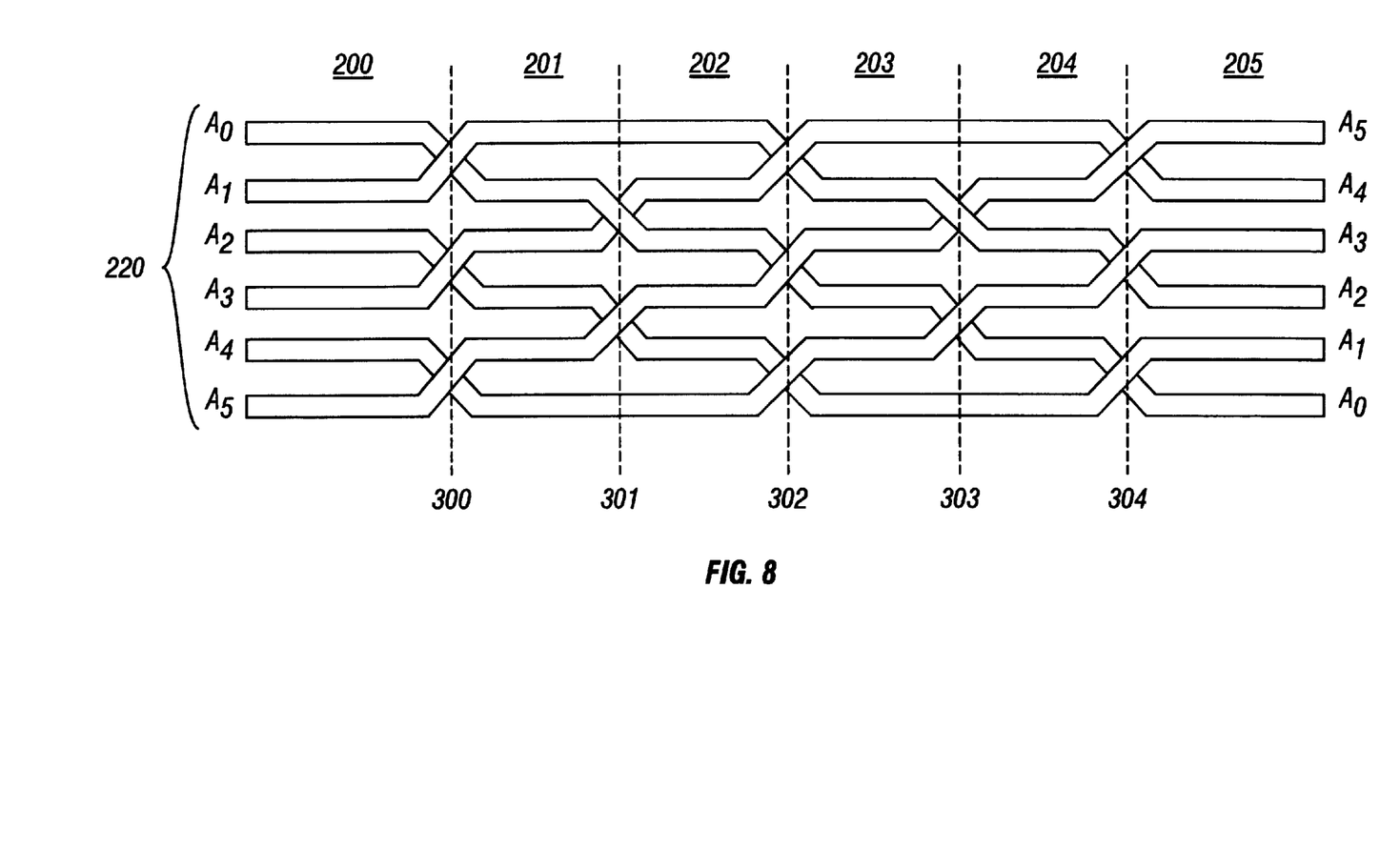
FIG. 8 illustrates an embodiment of the present with that rotates the route of a 1 of N signal.

As discussed previously, the present invention includes a variety of techniques for the routing of the rotated wire pack. For example, one embodiment of the present invention uses a standard cell in an IC layout package to place the rotated wire sections into the metal route. Another embodiment of the present invention provides for a more general method of routing a rotated wire pack that is suitable for automatic placement software. Referring now to FIG. 8, a 1 of N signal (represented here by a 1 of 6 signal) comprises a wire pack 220 that further comprises the wires that carry or conduct the logic values $A_0$, $A_1$, $A_2$, $A_3$, $A_4$, and $A_5$. We divide the metal route into N wire segments: 200, 201, 202, 203, 204, and 205, which produce the rotated wire sections 300, 301, 302, 303, and 304. At the "even" boundaries of the segments, we switch the even pairs of wires (the even pairs refers to the physical arrangement of the wires, not their logical values). The "even" boundaries occur between segments 200 and 201, 202 and 203, and 204 and 205. At the "odd" boundaries of the segments, we switch the odd pairs of wires. The "odd" boundaries occur between segments 201 and 202, and 203 and 204. The resulting rotated routing of the wire pack in FIG. 8 has the effect of ensuring that each wire is adjacent to two neighboring wires in the wire pack for part of its total same-metal-layer neighborhood.

We can show the present invention's capability to reduce speed coupling by observing that when the active wire in a 1 of 4 signal is evaluating true it is switching from a low voltage to a high voltage (the present invention works equally as well for active low signals as well). This switching of the voltage will cause a capacitive coupling effect to each of the wire's neighboring wires. Since none of the active wire's neighbors are switching either from low to high or from high to low, none of the neighboring wires will capacitively couple back on our active switching wire. In a non-predictable system such as occurs with typical dynamic systems or static systems, a rising wire adjacent to a falling wire will cause each wire to induce a charge opposing the direction of voltage change in the other wire, which produces a capacitive coupling effect that slows down each signal. The 1 of 4 signal of the present invention never encounters this condition so changing signals are never slowed because speed coupling does not exist in N-NARY logic.

Failure coupling occurs when a signal on a wire at a low voltage level has noise induced onto it from an adjacent signal. The induced noise from a neighboring wire onto the non-changing wire results in a sufficient voltage rise to cause a gate receiving the signal to think the signal is actually true. Failure coupling gets its name because the result of this behavior in clocked-restored logic is catastrophic, and slowing the clocks of the circuit will not correct the problem. The circuit designer must take care when routing signals to try and avoid creating opportunities for failure coupling. The rotated routing of the present invention (e.g., as shown in FIG. 6) helps reduce the likelihood of failure coupling in N-NARY logic. In comparison, static logic does not suffer catastrophic failure in this way because slowing the clocks will allow the wire time to recover. The intentional skewing of voltage trip points on input signals in the N-NARY logic family makes it more susceptible to induced noise. Therefore, failure coupling immunity is a much more critical issue with N-NARY logic than with static logic.

The present invention's reduction of the effective signal coupling also provides designers a benefit by reducing the need and strength of signal conditioning devices within the circuit. Since each non-switching wire in a 1 of 4 signal is adjacent to the switching wire for only one quarter of its intralayer neighborhood, the present invention can limit the maximum coupling effect to one quarter of the otherwise worst case. The degree that noise affects the coupling of a signal is a function of the strength of the signal conditioning devices on the cell generating the signal and the length of the signal wires, divided by the portion of capacitance that adversely couples. The rotated routing of the present invention dramatically reduces the number of cases where the designer must strengthen the signal conditioning device because the route plan of the present invention reduces the coupling effect by as much as a factor of four.

The preferred embodiment of the present invention, in addition to the above described rotated route plan, includes an isolation barrier that comprises a space, unoccupied channel, or a fixed potential wire such as 132 and 135 of FIG. 6 that borders each 1 of 4 signal. The isolation barrier helps ensure that the wire's signal coupling to its neighboring wires is greatly reduced. An unoccupied channel is reasonable on lower metal layers because a circuit designer must provide regions where layers can communicate—a place to put vias between layers. The preferred embodiment of the present invention is to leave a channel unoccupied than to route a ground or power wire because the unoccupied channel slightly reduces the overall capacitance of the 1 of 4 signal, and simplifies the job of automatic routers by providing space to readjust wire positions and place vias. While a vacant channel decreases the overall capacitance of the signal, it increases the percent capacitance that couples relative to routing a power or ground signal in the channel. We can discount this effect because the additional coupling is mostly inter-layer coupling.

Lower degrees of 1 of N encoding do not experience as large a failure coupling advantage since pairs of wires in lower 1 of N encodings are adjacent for more length. Higher degrees of 1 of N signals also experience no speed coupling, and we can further rotate the route to reduce failure coupling, but reductions below 25% of its capacitance are typically not necessary. Signals with greater than 1 of 4 encoding infrequently travel long enough distances to create a failure coupling concern because their wire inefficiencies justifies recoding them into the 1 of 4 form.

The result of a careful signal route is to reduce the effective capacitance of wires. The effective capacitance of a wire is greater than its actual capacitance because of signal coupling. For example, a wire that couples 50% of its capacitance to an adjacent wire that is switching in the opposite direction will have an effective capacitance of 1.5 times its actual capacitance. In cases where we can not predict what wires are adjacent to the wire in question, or we can not predict when the adjacent wires are switching, we must assume the worst case where two neighboring wires are switching in the opposite direction at the same time. This is true of most complex static designs, but is avoidable with N-NARY design and extensive use of 1 of N signals.

As an example, suppose a modern process with densely packed wires has a capacitance of 240 attofahrads per micron of wire, 160 attofahrads is to neighbor wires and 80 attofahrads is to adjacent layers. Without knowledge of the nature of the neighboring wires we must assume the worst case: the wires are switching in the opposite direction by the same voltage at the same time. This doubles the effective capacitance, and means an unintelligently routed static wire has an effective capacitance of 400 attofahrads per micron, two thirds worse than N-NARY 1 of 4 signals. This fact alone provides N-NARY logic with a 40% speed advantage in wire delays over traditional static or dynamic designs. Furthermore, a static signal may require 400 aF/$\mu$ to be charged/discharged per bit of information, while a 1 of 4 requires 240 aF/$\mu$ per two bits, or 240 aF/$\mu$ per two bit. This is only 30% the capacitance of the worst case static bit.

Table 6 illustrates the above discussion about the signal efficiency of a 1 of N signal:

TABLE 6

| Signal Type | Failure Coupling | Speed Coupling | Effective Capacitance for Speed Coupling purposes | bits per wire |
|---|---|---|---|---|
| static | 100% | 100% | 400 aF/u | 1 |
| 1 of 2 | 50% | none | 240 aF/u | .50 |
| 1 of 3 | 33% | none | 240 aF/u | .52 |
| 1 of 4 | 25% | none | 240 aF/u | .50 |
| 1 of 5 | 20% | none | 240 aF/u | .46 |
| 1 of 8 | 13% | none | 240 aF/u | .38 |

The advantages in failure and speed coupling of the N-NARY logic family are an indirect result of the decreased signal routing efficiency of N-NARY logic, and help to ameliorate its inefficiency. A traditional design could use routing tracks to shield signals from their neighbors and accomplish the same improvement. One can argue, however, that one can construct a static design where speed and failure coupling does not occur by careful planning of signal routes and signal arrival times. While this is true, the effort to both plan and analyze the route is substantial. The 1 of N signal routes of the N-NARY logic family are simple to plan and analyze. As long as the designer of a N-NARY logic circuit routes the 1 of N signal wires together as a wire pack and as a rotated route for the wires and includes the proper isolation barriers, the designer does not need to do a further detailed analysis.

In the prior discussion, we assumed that the interlayer coupling effect is zero. This assumption is not entirely true. The coupling to each wire in adjacent layers is nearly zero, but a group of wires can cause a noticeable coupling effect especially if the wires are all changing voltage in the same direction. This could happen with a perpendicularly routed bus, for example, which is transitioning from an all-zero state to an all-one state. Again, the problem is greater in the static or traditional dynamic families, where one can easily imagine the case where a 64-bit bus above a signal behaves as described here. If one assumes the bus above is 1 of 4 encoded and routed as described in the present invention, then only one fourth of the wires (of the bus), or one fifth of the route channels will be transitioning. This limits the problem dramatically, and makes it practical to assume a worst-case interlayer coupling, making its analysis a simple task.

Finally, it should be noted that N-NARY logic signals are glitch-less because they do not require time to settle-out as often occurs in static signals. The elimination of glitches further reduces the signal coupling analysis requirements, as well as reduces power consumption. The elimination of glitches and the near constant power consumption of N-NARY logic is important because it is more prone to failure due to its lower noise tolerance and inability to recover. Static logic noise failures are almost always fixable with an increase in cycle time, making static noise problems easy to debug, while on the other hand, debugging any type of coupling problem typically is very difficult. N-NARY logic failures are usually not fixable with increases in cycle time, making such failures very difficult to isolate. Noise analysis is critical in N-NARY logic, but the design style is crafted to make noise failures as unlikely as possible.

The present invention comprises a method and apparatus of routing a 1 of 4 signal to reduce the effective signal coupling between the signal wires. Other embodiments of the present invention include routing 1 of 3 signals and 1 of N signals. The present invention comprises a wire pack with a first, second, third, and fourth wire for routing a 1 of 4 signal in a semiconductor device. While routing the wires of the wire pack, the present invention rotates the route of each individual wire to reduce the signal coupling between the wires. The rotation of the wires allow each individual wire to be adjacent to each other wire for ¼ of the wire's route. Additionally, an isolation barrier may border the outside of the 1 of 4 signal wire pack to further reduce the signal coupling where the isolation barrier may comprise an unoccupied via channel or a fixed potential wire.

Other embodiments of the invention will be apparent to those skilled in the art after considering this specification or practicing the disclosed invention. The specification and examples above are exemplary only, with the true scope of the invention being indicated by the following claims.

We claim:

1. A rotated wire pack that routes a 1 of N signal between different cells in an integrated circuit (IC) to reduce the effective signal coupling between the individual signal wires of the 1 of N signal, comprising:

a plurality of non-rotated wires that routes a 1 of N signal between different cells in an IC;

an area of rotation in said IC that rotates said plurality of non-rotated wires; and a plurality of rotated wires that route said 1 of N signal formed from the rotation of said plurality of non-rotated wires, wherein the rotation of said 1 of N signal reduces the effective signal coupling between the individual wires of said 1 of N signal.

2. The wire pack of claim 1 further comprising an isolation barrier that borders the outside of the wire pack.

3. The wire pack of claim 2 wherein said isolation barrier comprises an unoccupied via channel.

4. The wire pack of claim 2 wherein said isolation barrier comprises a fixed potential wire.

5. The wire pack of claim 1 wherein said 1 of N signal comprises a 1 of 3 signal.

6. The wire pack of claim 1 wherein said 1 of N signal comprises a 1 of 4 signal.

7. A system for routing a 1 of N signal between different cells in an integrated circuit (IC) to reduce the effective signal coupling between the individual signal wires of the 1 of N signal, comprising:

a plurality of non-rotated wires that routes a 1 of N signal between different cells in an IC;

an area of rotation in said IC that rotates said plurality of non-rotated wires; and a plurality of rotated wires that route said 1 of N signal formed from the rotation of said plurality of non-rotated wires, wherein the rotation of said 1 of N signal reduces the effective signal coupling between the individual wires of said 1 of N signal.

8. The system of claim 7 further comprising an isolation barrier that borders the outside of the wire pack.

9. The system of claim 8 wherein said isolation barrier comprises an unoccupied via channel.

10. The system of claim 8 wherein said isolation barrier comprises a fixed potential wire.

11. The system of claim 7 wherein said 1 of N signal comprises a 1 of 3 signal.

12. The system of claim 7 wherein said 1 of N signal comprises a 1 of 4 signal.

13. A method for conveying a 1 of N signal between different cells in an integrated circuit (IC) to reduce the effective signal coupling between the individual signal wires of the 1 of N signal, comprising:

providing a plurality of non-rotated wires that routes a 1 of N signal between different cells in an IC;

providing an area of rotation in said IC that rotates said plurality of non-rotated wires;

providing a plurality of rotated wires that route said 1 of N signal formed from the rotation of said plurality of non-rotated wires wherein the rotation of said 1 of N signal reduces the effective signal coupling between the individual wires of said 1 of N signal; and conveying said 1 of N signal through said area of rotation.

14. The method of claim 13 further comprising an isolation barrier that borders the outside of the wire pack.

15. The method of claim 14 wherein said isolation barrier comprises an unoccupied via channel.

16. The method of claim 14 wherein said isolation barrier comprises an unoccupied via channel.

17. The method of claim 13 wherein said 1 of N signal comprises a 1 of 3 signal.

18. The method of claim 13 wherein said 1 of N signal comprises a 1 of 4 signal.

19. The method of claim 13 wherein said isolation barrier comprises a fixed potential wire.

20. A method of routing a 1 of N signal between different cells in an integrated circuit (IC) to reduce the effective signal coupling between the individual signal wires of the 1 of N signal, comprising:

providing a plurality of non-rotated wires that routes a 1 of N signal between different cells in an IC;

providing an area of rotation in said IC that rotates said plurality of non-rotated wires;

providing a plurality of rotated wires that route said 1 of N signal formed from the rotation of said plurality of non-rotated wires wherein the rotation of said 1 of N signal reduces the effective signal coupling between the individual wires of said 1 of N signal; and rotating said area of rotation.

21. The method of claim 20 further comprising an isolation barrier that borders the outside of the wire pack.

22. The method of claim 21 wherein said isolation barrier comprises an unoccupied via channel.

23. The method of claim 21 wherein said isolation barrier comprises a fixed potential wire.

24. The method of claim 20 wherein said 1 of N signal comprises a 1 of 3 signal.

25. The method of claim 20 wherein said 1 of N signal comprises a 1 of 4 signal.

* * * * *